United States Patent
Gruen

(10) Patent No.: US 8,586,999 B1
(45) Date of Patent: Nov. 19, 2013

(54) APPARATUS PERTAINING TO A CORE OF WIDE BAND-GAP MATERIAL HAVING A GRAPHENE SHELL

(71) Applicant: Dimerond Technologies, Inc., Downers Grove, IL (US)

(72) Inventor: Dieter M. Gruen, Downers Grove, IL (US)

(73) Assignee: Dimerond Technologies, LLC, Downers Grove, IL (US)

( * ) Notice: Subject to any disclaimer, the term of this patent is extended or adjusted under 35 U.S.C. 154(b) by 0 days.

(21) Appl. No.: 13/682,229

(22) Filed: Nov. 20, 2012

Related U.S. Application Data

(60) Provisional application No. 61/681,873, filed on Aug. 10, 2012.

(51) Int. Cl.
  *H01L 29/15* (2006.01)
  *H01L 29/06* (2006.01)
  *H01L 31/00* (2006.01)

(52) U.S. Cl.
  USPC ......... 257/77; 257/14; 257/E31.004; 977/742

(58) Field of Classification Search
  CPC ........ B82Y 10/00; B82Y 20/00; B82Y 30/00; H01L 27/14643; H01L 27/14683; Y02E 10/50
  USPC ....... 257/14.77, 431, E31.004; 977/734, 742, 977/750, 932
  See application file for complete search history.

(56) References Cited

U.S. PATENT DOCUMENTS

| | | | |
|---|---|---|---|
| 4,559,901 A | 12/1985 | Morimoto |
| 4,629,631 A | 12/1986 | Dearnaley |
| 4,634,600 A | 1/1987 | Shimizu |
| 4,663,305 A | 5/1987 | Mauldin |
| 5,132,105 A | 7/1992 | Remo |
| 5,200,916 A | 4/1993 | Yoshida |
| 5,209,916 A | 5/1993 | Gruen |
| 5,273,788 A | 12/1993 | Yu |
| 5,308,661 A | 5/1994 | Feng |
| 5,328,676 A | 7/1994 | Gruen |
| 5,370,855 A | 12/1994 | Gruen |
| 5,462,776 A | 10/1995 | Gruen |
| 5,698,328 A | 12/1997 | Bunshah |
| 5,772,760 A | 6/1998 | Gruen |

(Continued)

FOREIGN PATENT DOCUMENTS

WO 2007127727 11/2007

OTHER PUBLICATIONS

"Superconductivity at 28.6 K in a Rubidium-C.sub.60 Fullerene Compound, Rb.sub.x C.sub.60, Synthesized by a Solution-Phase Technique"; Amer. Chem. Soc. 0020-1669/1330-2962.

(Continued)

*Primary Examiner* — Nikolay Yushin
(74) *Attorney, Agent, or Firm* — Fitch Even Tabin & Flannery LLP

(57) ABSTRACT

A core consisting essentially of a wide band-gap material has a shell consisting essentially of graphene conformally disposed about at least a substantial portion thereof. By one approach the core has at least one bisectional dimension that does not exceed 100 nanometers. By one approach a connection between a pathway that connects the shell to the core comprises a photovoltaic junction.

21 Claims, 4 Drawing Sheets

(56) References Cited

U.S. PATENT DOCUMENTS

| | | | |
|---|---|---|---|
| 5,894,058 A | 4/1999 | Hatakeyama | |
| 6,007,969 A | 12/1999 | Hatakeyama | |
| 6,010,831 A | 1/2000 | Hatakeyama | |
| 6,020,677 A | 2/2000 | Blanchet-Fincher | |
| 6,048,671 A | 4/2000 | Hatakeyama | |
| 6,183,818 B1 | 2/2001 | Vohra | |
| 6,313,392 B1 | 11/2001 | Sato | |
| 6,534,923 B2 | 3/2003 | Espinosa | |
| 6,592,839 B2 | 7/2003 | Gruen | |
| 6,669,996 B2 | 12/2003 | Ueno | |
| 6,781,294 B2 | 8/2004 | Sakai | |
| 6,783,589 B2 | 8/2004 | Dahl | |
| 6,791,108 B1 | 9/2004 | Olivas | |
| 6,882,094 B2 | 4/2005 | Dimitrijevic | |
| 6,952,075 B2 | 10/2005 | Sakai | |
| 7,127,286 B2 | 10/2006 | Mech | |
| 7,224,532 B2 | 5/2007 | Dahl | |
| 7,259,320 B2 | 8/2007 | Take | |
| 7,309,446 B1 | 12/2007 | Kley | |
| 7,309,476 B2 | 12/2007 | Carlson | |
| 7,312,562 B2 | 12/2007 | Dahl | |
| 7,312,582 B2 | 12/2007 | Newman, Jr. | |
| 7,572,332 B2 | 8/2009 | Gruen | |
| 7,718,000 B2 | 5/2010 | Gruen | |
| 7,999,176 B2 | 8/2011 | Flood | |
| 8,257,494 B2 | 9/2012 | Gruen | |
| 2002/0163414 A1 | 11/2002 | Mayer | |
| 2003/0152700 A1 | 8/2003 | Asmussen | |
| 2003/0188637 A1 | 10/2003 | Ito | |
| 2003/0199710 A1 | 10/2003 | Liu | |
| 2003/0226423 A1 | 12/2003 | Liao | |
| 2004/0016397 A1 | 1/2004 | Carlson | |
| 2004/0109328 A1 | 6/2004 | Dahl | |
| 2004/0198048 A1 | 10/2004 | Dahl | |
| 2004/0198049 A1 | 10/2004 | Dahl | |
| 2004/0221795 A1 | 11/2004 | Scarsbrook | |
| 2004/0221796 A1 | 11/2004 | Swain | |
| 2004/0227138 A1 | 11/2004 | Dahl | |
| 2004/0227195 A1 | 11/2004 | Chang | |
| 2004/0247515 A1 | 12/2004 | Gardner | |
| 2004/0251478 A1 | 12/2004 | Dahl et al. | |
| 2005/0008560 A1 | 1/2005 | Kataoka | |
| 2005/0019114 A1 | 1/2005 | Sung | |
| 2005/0019576 A1 | 1/2005 | Dahl | |
| 2005/0168122 A1 | 8/2005 | Dahl | |
| 2005/0200260 A1 | 9/2005 | Swain | |
| 2005/0233489 A1 | 10/2005 | Nishikawa | |
| 2005/0275330 A1 | 12/2005 | Sung | |
| 2006/0121279 A1 | 6/2006 | Petrik | |
| 2006/0207647 A1* | 9/2006 | Tsakalakos et al. | 136/256 |
| 2006/0222850 A1 | 10/2006 | Xiao | |
| 2006/0261719 A1 | 11/2006 | Fox | |
| 2006/0269467 A1 | 11/2006 | Khabashesku | |
| 2006/0269567 A1 | 11/2006 | Yuen | |
| 2007/0082200 A1 | 4/2007 | Gruen | |
| 2007/0126312 A1 | 6/2007 | Sung | |
| 2007/0137684 A1 | 6/2007 | Gruen | |
| 2007/0146910 A1* | 6/2007 | Duston et al. | 359/834 |
| 2007/0187153 A1 | 8/2007 | Bertagnolli | |
| 2007/0232074 A1 | 10/2007 | Ravi | |
| 2008/0063888 A1 | 3/2008 | Sumant | |
| 2008/0087314 A1 | 4/2008 | Xiao | |
| 2008/0226840 A1 | 9/2008 | Asmussen | |
| 2009/0004092 A1 | 1/2009 | Dolmatov | |
| 2009/0017258 A1 | 1/2009 | Carlisle | |
| 2009/0042029 A1 | 2/2009 | Havel | |
| 2009/0057649 A1* | 3/2009 | Sutter et al. | 257/15 |
| 2009/0092824 A1 | 4/2009 | Gruen | |
| 2009/0242016 A1 | 10/2009 | Zach | |
| 2010/0279426 A1* | 11/2010 | Tour et al. | 436/149 |
| 2010/0330421 A1* | 12/2010 | Cui et al. | 429/217 |
| 2011/0096218 A1* | 4/2011 | Bratkovski et al. | 348/302 |
| 2012/0034464 A1* | 2/2012 | Chakraborty et al. | 428/402 |
| 2012/0102843 A1* | 5/2012 | Chakraborty et al. | 51/295 |
| 2013/0001516 A1 | 1/2013 | Hebard | |
| 2013/0040204 A1* | 2/2013 | Liu et al. | 429/231.95 |
| 2013/0045418 A1* | 2/2013 | Oguni et al. | 429/211 |
| 2013/0099196 A1* | 4/2013 | Wu et al. | 257/9 |

OTHER PUBLICATIONS

A. Das, S. Pisana, B. Chakraborty, S. Piscanec, S. K. Saha, U. . Waghmare, K. S. Novoselov, H. R. Krishnamurthy, A. K. Geim, A. C. Ferrari, A. K. Sood, "Monitoring Dopants by Raman Scattering in an Electrochemically Top-Gated Graphene Transistor," Nature Nanotechnology, 3, pp. 210-215 (2008).

Angus, John C. et al; "Metastable Growth of Diamond and Diamond-Like Phases"; Annu. Rev. Mater. Sci. 1991. 21:221-48.

Anne Simon Moffat; "When Diamonds Met Buckyballs" Science vol. 254. Science New Series, vol. 254, No. 5033 (Nov. 8, 1991), p. 800, Published by: American Association for the.

B. Liu, J. Boercker and E.S. Aydil, "Oriented Single Crystalline Titanium Dioxide Nanowires," Department of Chemical Engineering and Materials Science, pp. 1-7 © 2008 IOP Publishing Ltd.

B. Liu and E.S. Aydil, "Growth of Oriented Single-Crystalline Rutile TiO2 Nanorods on Transparent Conducting Substrates for Dye-Sensitized Solar Cells," J. Am. Chem. Soc., pp. 3985-3990, 2009.

Beck, Ranier D., et al, "Resilience of All-Carbon Molecules $C_{60}$ and $C_{84}$: A Surface Scattering Time-of-Flight Investigations"; J. Chem. Phys. 1991, 95, 8402-8409.

C. Feng-Ping, Z. Yu-Ming, Z. Yi-Men, T. Xiao-Yan, W. Yue-Hu, and C. Wen-Hao, "Temperature-Dependent Characteristics of 4H-Sic Junction Barrier Schottky Diodes," Chin. Phys. 13, 21., pp. 037304-1 to 037304-5 (2012).

C. Pfuetler, M. Ramstelner, 0. Brandt, F. Grosse, A. Rathsfeld, G. Schmidt, L. Geelhaar, and H. Riechert, "Raman Spectroscopy as a Probe for the Coupling of Light Into Ensembles of Sub-Wavelength-Sized Nanowires," Appl. Phys. Letters, 101 083104 (2012).

Curl, Robert F. et al; "Fullerenes"; Sci Amer. Oct. 1991, 54-63.

D. M. Gruen, M. H. Mendelsohn, and M. Kirk, "Growth and Morphology of Graphene on Silicon Carbide Nanoparticles," Materials Research Society Proceedings vol. 1411 (2012); doi: 10.1557/002012.1090; pp. 1-10.

D. Spry, P. Neudeck, R. Okojie, L-Y Chen, G. Beheim, R. Meredith, W. Mueller, and T. Ferrier, "Electrical Operation of 6H-SiC MESFET at 500C for 500 Hours in Air Ambient," 2004 IMAPS Int. Conference and Exhibition on High Temperature Electronics (inc 2004) May 19-12, 2004, Santa Fe, NM, Int. Microelectroncs and Packaging Socety (IMAPS) Washington, DC, 2004.

E. Garnett, and P. Yang, "Light Trapping in Silicon Nanowire Cells," Nano Letters 10, pp. 1082-1087 (2010).

Edelson, Edward; "Buckyball the Magic Molecule"; Popular Science, Aug. 1991, 52-57; 87.

Frenklach, Michael et al; "Growth Mechanism of Vapor-Deposited Diamond", J. Mater. Res. 3(1) Jan./Feb. 1988, 133-139.

G. A. Landis, D. Merritt, R. P. Raffaelle, D. Scheiman, "High. Temperature Solar Cell Development," NASA/CP.-2005-213431; pp. 241-247 (2002).

G. A. Landis, P. Jenkins, D. Scheiman, R. Rafaelle, "Extended Temperature Solar Cell Technology Development," AIAA 2nd int. Energy Conversion Engineering Conf., Providence, RI , pp. 1-7 (2004).

Gruen; "Diamonds From Dust" Submitted to Materials Technology May 1994.

Gruen et al.; "Buckyball Microwave Plasmas: Fragmentation and Diamond-Film Growth" J. Appl. Phys. 75 (3), Feb. 1, 1994.

Gruen et al.; "Fullerenes as Precursors for Diamond Growth Without Hydrogen or Oxygen Additions" Appl. Phys. Lett. 64 (12) Mar. 21, 1994.

Gruen et al.; "Turning Soot Into Diamonds with Microwaves" Submitted for Presentation at the 29th Microwave Power Symposium, Jul. 25-27, 1994.

H. Y Kim, J. Park, and H. Yang, "Direct Synthesis of Aligned Silicon Carbide Nanowires From the Silicon Substrates," Chem. Comm., 256 (2003).

H.Y. Kim, S.Y. Bae, S.S. Kim and J. Park, "Fabrication of SIC-C Coaxial Nanocables: Thickness Control of C Outer Layers," Chem. Com. 2634-2635 (2003).

(56) References Cited

OTHER PUBLICATIONS

International Preliminary Report on Patentability dated Nov. 4, 2008 from PCT/US2007/067297.
International Search Report and Written Opinion dated Oct. 16, 2008 Cited from PCT/US08/67297.
International Search Report and Written Opinion Dated Oct. 16, 2008 from PCT/US08/67297.
J.A. Edmond, H. Kong and C.H. Carter, Jr., "Blue LEDs, UV Photodiodes and High-Temperature Rectifiers in 6H-SiC" Physica B 185 (1993) 453-459 North-Holland.
J.C.C. Fan, "Theoretical Temperature Dependence of Solar Cell Parameters," Solar Cells, 17, 309 (1986).
J.E. Boercker, E.Enache-Pommer and E.S. Aydil, "Growth Mechanism of Titanium Dioxide Nanowires for Dye-Sensitized Solar Cells," Department of Chemical Engineering and Materials Science, University of Minnesota, pp. 1-10 © IOP Publishing Ltd., Nanotechnololgy 19 (2008).
K. Zhu, N.R. Neale, A. Miedaner and A.J. Frank; "Enhanced Charge-Collection Efficiencies and Light Scattering in Dye-Sensitized Solar Cells Using Oriented TiO2 Nantubes Arrays," published on Web Dec. 2, 2006; American Chemical Society.pp. 69-74; Nano Letters vol. 7 (2007).
Kratschmer, W. et al.; "Solid $C_{60}$ : A New Form of Carbon", Nature, vol. 347, Sep. 27, 1990, pp. 354-358.
Kroto, H. W. et al; "$C_{60}$ : Buck Minster Fullerene"; Chem. Rev. 1991, 91, 1213-1235.
Lykke, K. R. et al., "Spectrometric Characterization of Purified $C_{60}$ and $C_{70}$"; Mats. Res. Soc. Symposium Proc. vol. 206, 679 (1991).
Meijer, Gerard et al; "Laser Deposition of Carbon Clusters on Surfaces: A New Approach to the Study of Fullerenes"; J. Chem. Phys. 93(11), Dec. 1990.
Meilunas et al.; "Nucleation of Diamond Films on Surfaces Using Carbon Clusters" Applied Physics Letters, vol. 59, No. 26, Dec. 23, 1991.
Parker, D. H. et al, "High Yield Synthesis, Separation and Mass Spectrometric Characterization of Fullerenes $C_{60}$ to $C_{266}$", J. Am. Chem. Sco. 113, 7499-7503 (1991).
R. Voggu, B. Das, C. S. Rout, C. N. R. Rao, "Effects of Interaction of Electron-Donor and Acceptor Molecules on the Electronic Structure of Graphene," arxiv.org/pdf/0808.3165, pp. 1-10 (2009).
R.R. Nair, P. Blake, A.N. Grigorenko, K.S. Novoselov, T. J. Booth, T. Stauber, N.M.R. Peres and A.K. Geim; "Universal Dynamic Conductivity and Quantized Visible Opacity of Suspended Graphene;" Manchester Centre for Mesoscience & Nanotechnology, University of Manchester, M13.9POL, Manchester, UK, Graphene Industries Ltd., 32 Holden Avenue, M16 8TA, Manchester, UK and Department of Physics, University of Minho, P-4710-057, Braga.
S. Bailey, G. Landis, A. Hepp, R. Raffaelle, "Future Photovoltaic Power Generation for Space-Based Power Utilities," IAFf-02-R.4.06 Selnt. Astronautical Congress/The World Space Congress (2002).
S. Pisana, M. Laueri, C. Casiraghi, K. S. Novoselov, A. K. Geim, A. C. Ferrari, and F. Mauri, "Breakdown of the Adiabatic Born-Oppenheimer Approximation in Graphene," Nature Materials, 6, pp. 198-201 (2007).
S. Shivaraman, L. H. Herman, F. Rana, J. Park, and M. G. Spencer, "Schottky Barrier Inhomogeneities at the Interface of Few Layer Epitaxial Graphene and Silicon Carbide," Appl. Phys. Lett., 100 183112 (2012).
S. Tongay, M. Lemaitre, X. Miao, B.R. Appleton and A.F. Hebard; Rectification at Graphene-Semiconductor Interfaces: Zero-Gap Semiconductor-Based Diodes,: American Physical Society; pp. 1-10; Published Jan. 17, 2012.
S. Tongay, T. Schumann and A.F. Hebard; Graphite Based Schottky Diodes Formed on Si, GaAs, and 4H-SiC Substrates; Applied Physics Letters 95, 222103 (2009).
S. Vizzini, H. Enriquez, S. Chiang, H. Oughaddou and P. Soukassian, "Nano-Structures Developing at the Graphene/Silicon Carbide Interface," Surface Science, 605 pp. L6-L11; (2011).
S.K. Sarkar, J.Y. Kim, D.N. Goldstein, N.R. Neale, K. Zhu, C.M. Elliott, A.J. Frank and S.M. George, "IN2S3 Atomic Layer Deposition and Its Application as a Sensitizer on TiO2 Nanotube Arrays for Solar Energy Conversion," Published on Web Apr. 13, 2010; American Chemical Society, pp. 8032-8039; J. Phys. Chem. C.
T. J. Anderson, K. D. Hobart, L. 0. Nyakiti, V. D. Wheeler, R. L. Myers-Ward, J. D. Caldwell, F. J. Bezares, G. G. Jernigan, M. J. Tadjer, E. A. Imhoff, A. D. Koehler, D. K. Gaskill, C. R. Eddy, snf F. J. Kub, "Investigation of the Epitaxial Graphene/p-SIC ," junction, IEEE Electron Device Letters, 33, pp. 1610-1612 (2012).
T. Zimmermann, M. Kubovic, A. Denisenko, K. Janischowsky, O.A. Williams, D.M. Gruen and E. Kohn; "Ultra-Nano-Crystalline/Single Crystal Diamond Heterstructure Diode;" Elsevier B.V.; Science Direct; Diamond and Related Materials ; pp. 416-420; © 2005.
Van, Jon; "Exotic Form Opens New Carbon Uses," Chicago Tribune, Sunday, Nov. 3, 1991.
Wasielewski, M. R., et al "Triplet States of Fullerenes $C_{60}$ and $C_{70}$ "; Electron Paramagnetic Resonance Spectra, Photophysics and Electronic Structures, J. Am. Chem. Soc. 113, 2774-2776 (1991).
Wurz, P. and Lykke, R.; "Delayed Electron Emission from Photoexcited $C_{60}$"; J. Chem Phys. 95, 7008-7010 (1991).
Y. Zhuo; C. Wu, S. Han, B. Chi, J. Pu, T. Jin and L. Jian, "Oriented Nanostructured Titanates Array From Low Concentration Alkaline Solution via Hydrothermal Process," J. Nanosci. Nanotechnol. 2011, vol. 11, No. 3, pp. 2298-2303.
Z. Liu, S. Wang, F. Yu, Y. Zhang and H Zhao, "Ti Schottky Barrier Diodes on n-type 6H-Sic," 0-7803-6520-8/01/$10.00, pp. 1183-1186, © 2001 IEEE.
"Silicon Carbide High-Temperature Power Rectifiers Fabricated and Characterized," http://www.grc.nasa.gov/WWW/RT/RT1995/2000/2510n.htm; Jan. 23, 2013.

* cited by examiner

APPARATUS PERTAINING TO A CORE OF WIDE BAND-GAP MATERIAL HAVING A GRAPHENE SHELL

RELATED APPLICATION(S)

This application claims the benefit of U.S. Provisional application No. 61/681,873 entitled Graphene Shell/Core Nano structures and filed Aug. 10, 2012, which is incorporated by reference in its entirety herein.

TECHNICAL FIELD

This invention relates generally to the use of graphene.

BACKGROUND

Graphene is a substance made of pure carbon, with atoms arranged in a regular hexagonal pattern similar to graphite, but in a one-atom thick sheet (hence leading to the oft-used graphene descriptor "two-dimensional"). Graphene is the basic structural element of many carbon allotropes including graphite, charcoal, carbon nanotubes, and fullerenes. Graphene has a number of interesting optical, electrical, and thermal properties and has been the subject of much recent research. For example, the 2010 Nobel Prize in Physics went to researchers working on "groundbreaking" experiments involving graphene.

Recent interest includes exploring the use of graphene in a photovoltaic component such as a so-called solar cell. Note, for example, that a stack of forty-three graphene layers has an opacity of about ninety-nine percent and essentially completely absorbs light throughout the visible and near infrared regions of the solar spectrum notwithstanding having a film thickness of less than fifteen nanometers.

That said, and although a graphene layer having a thickness of only about one ten-thousandth the width of a human hair would in fact absorb essentially all of the light incident upon it, other requirements must be met in order for graphene to function as a useful part of a solar cell. In such a device, the absorption of electromagnetic radiation results initially in the excitation of electrons accompanied by the creation of electron/hole pairs. A corresponding useful behavior is therefore the existence of a potential barrier that impedes excited electrons from recombining with holes. Rather than recombining with the release of energy as heat, electrons and holes in a useful device are preferably enabled to travel in opposite directions, thereby allowing the completion of an electrical circuit from which energy can be extracted as electricity.

The prior art has sought to meet this requirement through the creation of alternating layers of graphene and a material that captures the photo-generated electrons. For example, multilayer hybrid films consisting of alternating layers of graphene and electron-capturing titanium oxide have been realized and characterized for their potential as photovoltaic devices. Those hybrid layers were built up using laborious layer-by-layer procedures that required elaborate, expensive, synthetic methodologies. Accordingly, even though such hybrid films exhibit interesting photovoltaic properties, the corresponding burdens associated with their synthesis discourages those skilled in the art from seriously considering such films as candidates in a commercial application setting.

BRIEF DESCRIPTION OF THE DRAWINGS

The above needs are at least partially met through provision of the apparatus pertaining to a core of wide band-gap material having a graphene shell described in the following detailed description, particularly when studied in conjunction with the drawings, wherein.

Figure 1:
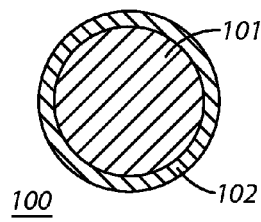
FIG. 1 comprises a side-elevational, sectioned schematic view as configured in accordance with various embodiments of the invention.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to these various embodiments, a core consisting essentially of a wide band-gap material has a shell consisting essentially of graphene conformally disposed about at least a substantial portion thereof. By one approach the core has at least one bisectional dimension that does not exceed 100 nanometers. By one approach a connection between a pathway that connects the shell to the core comprises a photovoltaic junction.

The core itself can comprise any of a variety of materials (including, for example, boron, iron, titanium, zinc, carbon or silicon borides, carbides, nitrides, oxides, or sulfides, to note but a few examples in these regards). The present teachings will accommodate a wide variety of forms for the core including, by way of example, a plurality of annealed nanoparticles (such as but not limited to a nanowire) of the wide band-gap material, a nanorod consisting of the wide band-gap material, a nanofibril consisting of the wide band-gap material, a fabric consisting of the wide band-gap material, or a nanotube consisting of the wide band-gap material.

By one approach a plurality of such cores/shells are configured in such a way that their longitudinal axes are oriented at least substantially parallel to one another. At least some of these cores can be electrically connected to a shared electrical pathway to facilitate moving electrons from the cores away from the cores. Such a configuration can serve well, for example, as the basis for a solar cell.

These teachings are highly flexible in practice and will accommodate a wide range of useful variations. As one example in these regards, the core and/or the shell can be doped as desired using one or more n-type dopants and/or p-type dopants. Selective doping, in turn, can enhance a particular desired performance characteristic of the resultant apparatus.

As another example, the core/shell configurations described herein remain operationally viable at temperatures up to about 800 to 900K. This relative immunity to a wide range of temperatures in turn permits a corresponding apparatus to be deployed in application settings that would typically be unthinkable for a solar cell.

Those skilled in the art will also appreciate that the materials required to assemble a solar cell in these regards can be wholly comprised of materials that are plentiful, inexpensive, and generally environmentally benign. These observations, coupled with the promise of considerably higher operational efficiencies than are ordinarily associated with solar cell performance, speak convincingly of an economically viable (in fact, liberating) approach to solar-based generation of electricity.

These and other benefits may become clearer upon making a thorough review and study of the following detailed description. Referring now to the drawings, FIG. 1 depicts an object 100 having a core 101 that consists essentially of a wide band-gap material. This reference to a wide band-gap material will be understood to refer to a material having a valence band and a conduction band that differ by at least two electron volts. The reference to the core 101 consisting essentially of this material will be understood to refer to a core 101 that is largely pure in these regards but which can include trace impurities (and which can also include, for example, purposefully-introduced n-type or p-type dopants designed to elicit specific electrical performance).

In FIG. 1 the core 101 comprises a sphere. As will be shown below the core 101 can in fact assume any of a wide variety of regular and irregular forms. That said, by one approach the core 101 has at least one nanoscale bisectional dimension that does not exceed, for example, one hundred nanometers. This requirement does not specify that all dimensions of the core 100 are so limited, however. When the core 101 comprises, for example, a nanorod the core 101 might have a longitudinal length in excess of many hundreds of nanometers. (It is not necessary that the referred-to bisector divide the core 101 into two equal halves. Instead, as used herein a reference dimension is a "bisector" if the corresponding line passes through opposing points on the periphery and includes a geometric center of the core 101 as per a corresponding frame of reference. For example, when the core 101 comprises a cylinder, a lateral cross-sectional diameter of that cylinder can serve as a bisector for these purposes.)

The depicted object 100 also has a shell 102 consisting essentially of graphene conformally disposed about at least a substantial portion of the core. As used herein this reference to "substantial" will be understood to refer to an amount in excess of fifty percent.

The thickness of this graphene shell 102 can vary with the application setting. For many purposes, however, the thickness can range from about one layer to about forty-three layers or so. Accordingly, for many purposes the thickness of the shell 102 is very thin. Generally speaking, when employed in a photovoltaic setting, the number of layers need be no more than are required to achieve a particular amount of light absorption. It will be presumed herein that the shell 102 has an essentially uniform thickness for a given object 100 but these teachings will accommodate variations in these regards if desired and/or as appropriate to the needs of a given application setting.

Generally speaking, electron/hole recombination rates are dependent on a variety of factors. In order to achieve a high efficiency solar cell, the material selected for the core 101 can be chosen to optimize charge separation in preference to electron/hole recombination.

By one approach, the shell 102 is conformally applied to the core 101 by contacting a reactant at elevated temperatures with nanopowders of different compounds such as borides, carbides, nitrides, oxides, and sulfides. Typical examples of such compounds are boron carbide, silicon carbide, silicon nitride, silicon oxide, titanium oxide, zinc oxide, iron sulfide, and so forth.

More particularly, by one approach the corresponding synthesis carries out the reaction(s) using size and shape-selected nanopowders of the selected material for the core 101. Per the reaction, hydrocarbon molecules decompose on the surfaces of the nanopowders to form the graphene layer(s) that comprises the shell 102. In particular, the nanomaterials cited above act as catalysts for the reactions to form graphene and result in highly unusual core/shell nanostructures in which the shell 102 is graphene and the cores 101 are composed of nanoparticles of the particular starting material. Additions of dopants during or after synthesis allows their incorporation into the shell or functionalization of the shell to produce desired dopant levels.

By one approach the reactions to form the graphene occur with first order kinetics at temperatures that are typically about 1000 degrees Centigrade lower in the presence than in the absence of the nanopowders. At least one reason for this dramatic lowering in reaction temperature is believed to be the ubiquitous presence of defects of various kinds on the surfaces of the nanomaterials. Because of the large surface area of the nanomaterials (relatively speaking) and the lowering of the activation energies of the reactions due to the presence of defects, the reaction kinetics are rapid at modest reaction temperatures.

The reaction rates are largely determined by temperature and temperature, of course, can be carefully controlled. Shell 102 thickness (i.e., the number of graphene layers), however, is largely controlled by the length of time the reaction is allowed to proceed at a controlled temperature. A layer-by-layer growth mechanism is therefore inherent in the presently-disclosed synthesis method making this a very powerful way of precisely controlling a key parameter that can serve as an important determinant of the ultimate performance of the material in a solar cell device.

This extremely versatile aspect of the described one-step synthesis method therefore allows one to adjust, in addition to core size and composition, the shell thickness parameter so as to be able to optimize the graphene photophysics. As alluded to above, the photophysics of graphene (involving excited-state transition lifetimes and charge-transport kinetics) can be highly useful to achieve a highly-efficient and commercially-viable solar cell. For example, a film consisting of 20 nanoparticles (each sized from around ten to eighty nanometers) that each have a monolayer graphene shell 102 would have a thickness of about 200-1600 nanometers and would absorb around ninety-five percent of the incident light. Such a very thin film solar cell would be expected to operate at considerably higher efficiencies while being considerably less costly than prior art solar cells.

Figure 2:
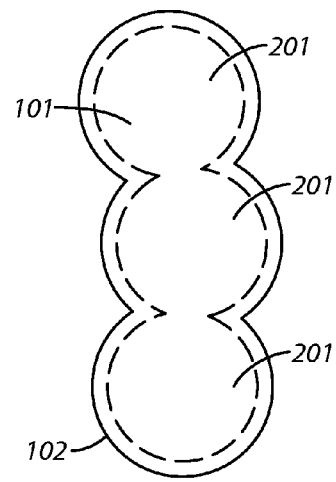
FIG. 2 comprises a side-elevational schematic view as configured in accordance with various embodiments of the invention.

The examples above presumed to encapsulate individual small particles with a graphene shell. These teachings will accommodate other approaches, however. By one approach, for example, the core 101 can comprise a plurality of nanoparticles 201 that are annealed to one another as illustrated in FIG. 2. In this simple example the resultant nanowire of the wide band-gap material comprises three sequentially-connected nanoparticles 201. It will be understood, of course, that such a nanowire can comprise a considerably larger number of such nanoparticles 201. Accordingly, although the lateral cross section of such a nanowire may remain within the aforementioned one hundred nanometer bisectional dimensional limitation the length of the nanowire can be of essentially any dimension of choice. By one approach the shells are applied subsequent to the annealing step.

By way of a more specific example (but without intending any specific limitations by way of these corresponding details), silicon carbide nanowires can be synthesized in a variety of ways. For example, chemical vapor deposition procedures can serve in these regards. As another example, silicon carbide nanoparticles can be heated to 2000K in the presence of a catalyst such as iron powder.

The graphene shells 102 surrounding the nanowires can in turn be synthesized to a predetermined thicknesses by reaction of the nanowires with carbonaceous substances at elevated temperatures as already stated or by heating the nanowires in vacuum to 1500K or in one bar of argon to 2000K. One straightforward and economically attractive synthesis procedure for objects 100 having a silicon carbide nanowire core 101 and a graphene shell 102 would comprise heating commercial silicon carbide powders to 2000K in argon to grow the nanowires, following which the catalyst is removed and the resultant material then reheated to 2000K in argon to form epitaxial graphene layers to a predetermined thickness and doping level.

Figure 3:
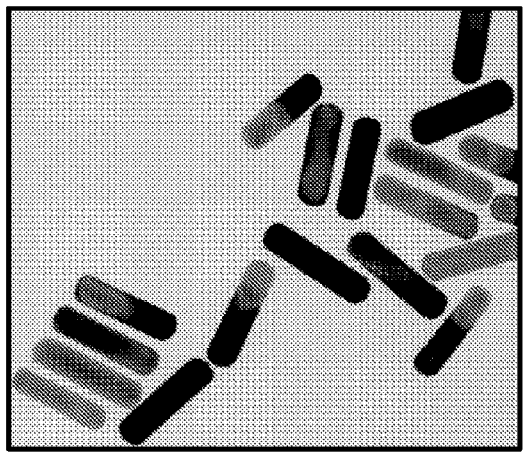
FIG. 3 comprises a top plan view as configured in accordance with various embodiments of the invention.
Figure 4:
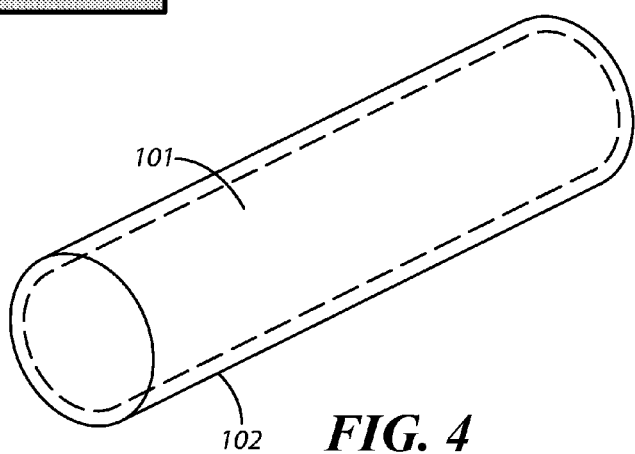
FIG. 4 comprises a perspective schematic view as configured in accordance with various embodiments of the invention.
Figure 5:
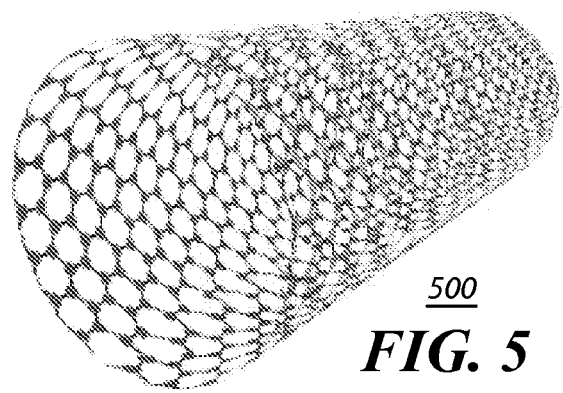
FIG. 5 comprises a perspective view as configured in accordance with various embodiments of the invention.
Figure 6:
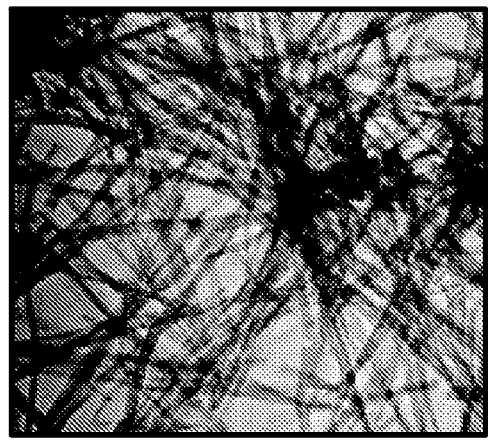
FIG. 6 comprises a top plan view as configured in accordance with various embodiments of the invention.
Figure 7:
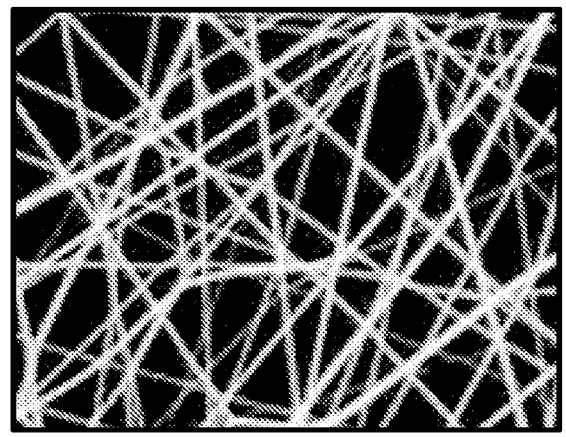
FIG. 7 comprises a top plan view as configured in accordance with various embodiments of the invention.

It may be noted and emphasized that these teachings will accommodate using cores 101 having any of a wide variety of forms. With reference to FIG. 3, for example, the cores 101 can comprise nanorods 300. As illustrated in FIG. 4, a graphene shell 102 of a desired thickness can then be readily conformally applied to such a core 101. By way of further illustrative examples, FIG. 5 illustrates a core 101 comprising a nanotube 500, FIG. 6 illustrates cores 101 comprising nanofibrils 600, and FIG. 7 illustrates a core 101 comprising a nanofabric 700. Again, these examples are intended to represent a non-exhaustive listing of possibilities in these regards.

Generally speaking, a viable solar cell will comprise a plurality of such objects 100 and hence will comprise a plurality of cores 101 that each have a shell 102 disposed thereabout. By one useful approach, when the cores 101 comprise generally longitudinal members (such as nanowires, nanorods, and/or nanotubes), the plurality of cores 101 can be disposed with their longitudinal axes oriented at least substantially parallel to one another. In particular, by one approach these longitudinal axes are also oriented substantially coaxial and parallel to anticipated light beams.

Figure 8:
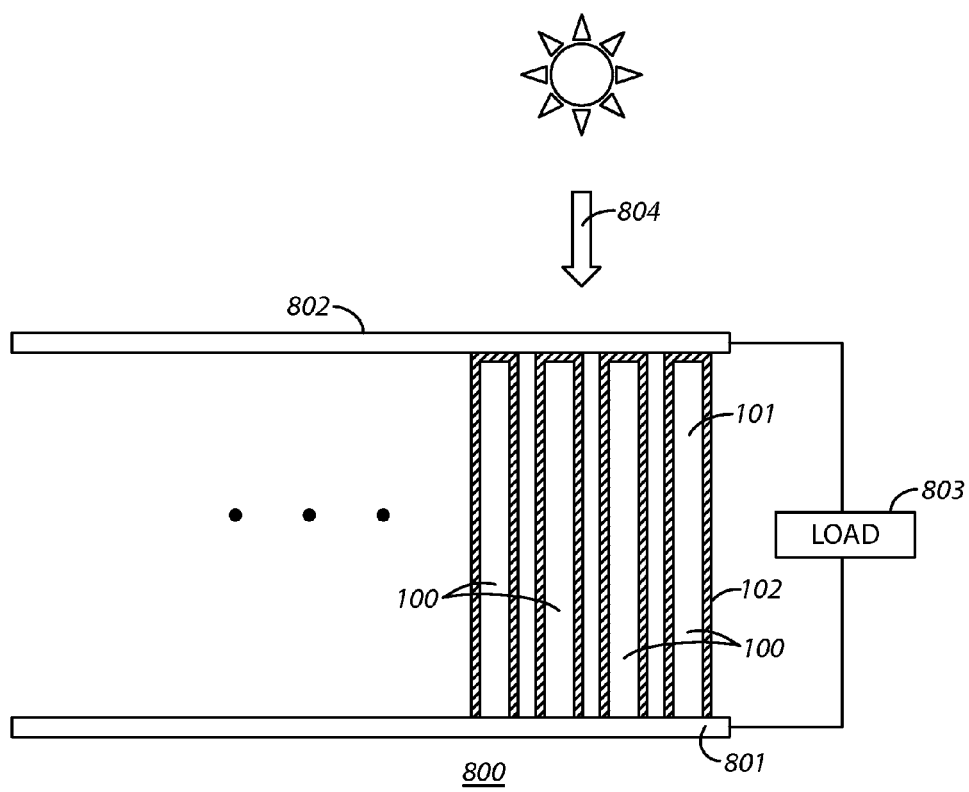
FIG. 8 comprises a side-elevational schematic view as configured in accordance with various embodiments of the invention.

FIG. 8 presents one illustrative example in these regards. In this illustrative example a solar cell 800 has a first electrical pathway 801 and an opposing second electrical pathway 802 (the latter being transparent or at least translucent to permit light 804 to pass therethrough). These two electrical pathways 801 and 802 in turn couple to an electrical load 803 of choice (including both electrically-operated devices as well as electrical-energy storage devices such as batteries).

In this example, each of the cores 101 physically and electrically connects to the first electrical pathway 801 but not to the second electrical pathway 802. By one approach, the longitudinal axes of these cores 101 can range from about two hundred nanometers to no more than about fifteen hundred nanometers with a longitudinal length of about four hundred nanometers being particularly useful for many application settings.

The graphene shells 102, in turn, can have, by one approach, no more than about five layers of graphene with about four such layers being suitable for many purposes. For example, when the core 101 has a length of about 400 nanometers, four layers of graphene for the shell 102 will tend to capture essentially all of the incident light 804.

By one approach, the nanowires that comprise the cores 101 in this example essentially consist of silicon carbide and have a length of from about three hundred to about three thousand nanometers and cross-sectional diameters of from about ten to about eighty nanometers coaxially. These cores 101 are surrounded by a monolayer or no more than a few layers of graphene that essentially constitute the graphene shells 102.

These aligned silicon carbide cores 101 can be grown prior to growing the shells 102 by reacting a dilute mixture of methane in hydrogen with a silicon substrate carrying a catalyst to enable a vapor-liquid-solid growth mechanism. By one approach the catalyst facilitates the growth of aligned silicon carbide nanowires. A catalyst that forms a gallium/iron/silicon alloy, for example, allows the reaction with the carbon in the methane to occur in such a way as to lead to the growth of aligned silicon carbide nanowires.

The aligned silicon carbide nanowires can be grown to the desired length by allowing the reaction to occur for a corresponding length of time at a temperature of about 1300 to about 1600 K. When the desired nanowire length has been reached, the gas mixture flowing over the nanowires is changed to pure methane to thereby create conditions for growing the graphene shells 102. Again, the number of layers in the shells 102 is controlled by the length of time growth is allowed to proceed at a given temperature.

The bottoms of the resulting nanowire nano structures are attached to the first electrical pathway 801 that comprises, for example, silicon or some other conducting base, thus electrically connecting all of the cores 101. The tops of the nanowires carry graphene layers that are in electrical contact with all of the coaxial graphene shells 102 surrounding the nanowire cores 102. The growth process thus automatically creates a solar cell nanostructure that provides separate electrical connections to cores 101 and shells 102.

By one approach, dark current and majority carrier transport can be minimized by preventing contact of the coaxial graphene shells 102 with the silicon base and with the silicon carbide nanowire cores. This can be accomplished, for example, by chemical vapor deposition of a monolayer or multilayers of an insulator such as silicon dioxide prior to depositing the graphene shells 102.

Solar energy conversion efficiency associated with such a configuration is strongly enhanced in the nanostructured radial coaxial shell/core nanowire configuration over conventional planar solar cell configurations in part because electron diffusion lengths are very much shorter. This is particularly the case with regard to the thin graphene shells 102.

In addition, it may be observed that such a so-configured solar cell functions by virtue of the internal photoemission of energetic electrons emanating from the graphene layers and that are injected into the conduction band of the silicon carbide cores 101 upon irradiation by light. The tens of milliamperes per square centimeter of photocurrent produced in this way is expected to have energies of about one electron volt under standard sunlight intensities. The stated cell performance is due in part to the potential barrier created when graphene forms a junction with silicon carbide. The magnitude of this potential barrier is estimated to be somewhat less than one electron volt based on calculations using the Anderson approximation which employs known values of quantities such as the work functions, electron affinities and electrical conductivities of graphene and silicon carbide.

The described graphene/silicon carbide junction is also noteworthy in that the junction joins graphene (a zero bandgap material in which electrons behave as if they were massless fermions obeying Dirac wave functions according to the theory of quantum electrodynamics) to a wide band-gap semiconductor, silicon carbide, in which electrons obey the dictates of quantum mechanics. One of the functions of this junction, whose width is less than one nanometer, is to effectively transform "Dirac" electrons into "Schroedinger" electrons during the process of photoemission while concurrently minimizing the recombination of electrons with holes.

Generally speaking, restructuring of the atoms constituting such a junction has been shown to occur during junction synthesis. This restructuring still further enhances the interfacial area thus facilitating the complex functions of the junction. It is known, for example, that the position of the Fermi level of graphene changes at the heterojunction with a wide band-gap semiconductor. This exceptional circumstance does not occur with other metal/semiconductor heterojunctions at least in part because unlike the very large number of quantum states found with ordinary metals, graphene has only a small number of states near the Fermi level. The unique quantum physics of the graphene/semiconductor heterojunction is expected to benefit the characteristics of quantum structured solar cells such as their dark current behavior.

Another useful attribute of a graphene/silicon carbide solar cell is its temperature stability. Both graphene and silicon carbide are high-temperature materials in that they have very high melting points and are thermodynamically stable. Diffusional processes of dopants in these materials are very slow at temperatures up to about 1000K thus helping to preserve the rectifying properties of the corresponding Schottky barrier up to temperatures of at least 600K.

The graphene/wide band-gap semiconductor materials all share these attributes with graphene/silicon carbide being an example. The graphene/wide band-gap materials are therefore uniquely capable of functioning as high-temperature solar cells with immense implications for the economics of solar power generation. For the first time, for example, it is possible to produce solar power in concentrating solar power plants.

Figure 9:
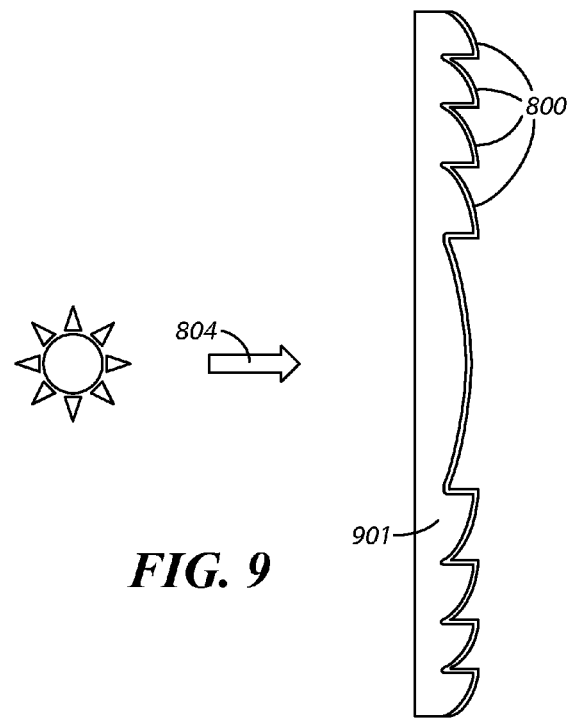
FIG. 9 comprises a side-elevational schematic view as configured in accordance with various embodiments of the invention.

By one illustrative approach, and referring to FIG. 9, such solar cells 800 can be employed in conjunction with one or more Fresnel lenses 901 including linear Fresnel lens installations. By one approach, and as illustrated, it would even be possible to dispose the solar cells 800 directly on the lens 901 itself.

Figure 10:
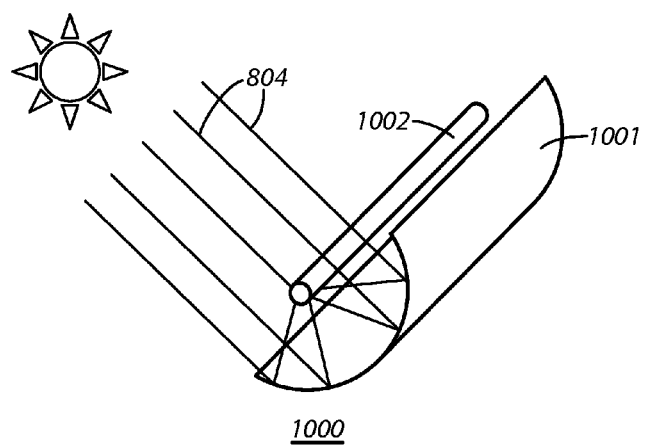
FIG. 10 comprises a perspective schematic view as configured in accordance with various embodiments of the invention.
Figure 11:
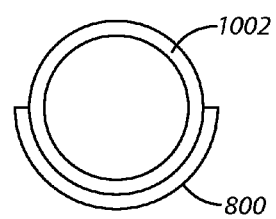
FIG. 11 comprises a side-elevational schematic view as configured in accordance with various embodiments of the invention.

By way of another illustration and referring now to FIGS. 10 and 11, solar cells employing the present teachings can be applied in combination with a solar-heat based system 1000 having liquid carrying tubes 1002 that absorb heat from sunlight 804 reflected from a corresponding parabolic trough solar collector 1001. (Such solar-heat based systems are known in the art and therefore require no further elaboration here.) In particular, and as illustrated in particular in FIG. 11, solar cells 800 as described herein can be externally disposed on at least a portion of the liquid-carrying conduit 1002 (such as on a portion of the conduit 1002 that receives the reflect light from the parabolic trough solar collector 1001).

So configured, direct conversion of photons to electricity is provided by the solar cells 800 while the associated heat is converted to electricity via, for example, conventional electromagnetic induction technology. Such a co-generation solar-based system can potentially convert around fifty percent of the solar flux energy content at moderate temperatures to electricity with photovoltaics and electromagnetic induction making roughly equal contributions.

The efficiency of graphene shell/silicon carbide nanowire core solar cells depends not only on the nature of the junction between them as explained above but also on the ability of light to be absorbed by the nanostructured graphene shells in the first instance. In particular, in two out of three dimensions, such nanowires are small as compared with the wavelength of solar radiation. In fact, the absorption of light appears to be enhanced by about a factor of two for such nanowires as compared to bulk material. At least part of the reason for this appears to be that electromagnetic radiation enters or is transmitted by the aligned nanowires along their entire length. Thus, the large surface-to-volume ratio (compared to bulk materials) contributes significantly to the quantity of absorbed light.

As a result, radiation is absorbed very efficiently by such graphene shell/silicon carbide nanowires. Furthermore, the light is distributed over a large graphene surface area because the graphene shells 102 surround each nanowire in such an embodiment. It is likely therefore that much higher radiation intensities can be tolerated by such nanostructured cells.

Each one of the vast numbers of graphene shell/silicon carbide nanowires present in such a photovoltaic device comprises a unique structure that individually acts as an effective nantenna and optical rectifier. Calculations for cylindrical nanowires of radius twenty nanometers show that total light absorption occurs for nanowire lengths of about four hundred nanometers (which is, in turn, in the range of the wavelengths of visible light). Each graphene/silicon carbide nanowire can therefore be seen to simultaneously possess both the light (electromagnetic wave) gathering power of an antenna and the rectifying properties of a photovoltaic device.

The opacity of graphene (which is generally independent of the wavelength of light), combined with its use as a nantenna shell surrounding the silicon carbide nanowires, helps to ensure maximal harvesting of the incident sunlight. Consequently, the high solar collection efficiency of these graphene-based nantennas coupled with the highly efficient rectification properties of the graphene/silicon carbide junctions combine to create a new and highly efficient class of solar cells.

In addition to such clear benefits as an enabler of efficient and inexpensive solar cells, these teachings can also be readily extended to other areas of interest. For example, these teachings can be readily leverages in favor of a new class of biosensors: color sensitive retinal implants. Just as cochlear implants stimulate auditory nerve cells in the cochlea of the ear, so retinal implants stimulate cells in the retina of the eye that connect to the optic nerve. The search for such visual aids has been underway for a long time with the ultimate goal of providing color vision to the visually impaired. The ability to optimize the electrical response to light wavelength by controlling the length of graphene shell/silicon carbide nanowires make these nano structures uniquely suited to color discriminative retinal implant applications. Furthermore, because these biosensors are photosensors as well as photovoltaics, the incoming light itself can source the energy that powers their operation thus potentially obviating the need for batteries.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

I claim:

1. An apparatus comprising:
   a core consisting essentially of a wide band-gap material, wherein the core has at least one bisectional dimension that does not exceed 100 nanometers;
   a shell consisting essentially of graphene conformally disposed about at least a substantial portion of the core;
   at least one liquid-carrying conduit;
   wherein the core and shell are externally disposed on the liquid-carrying conduit.

2. The apparatus of claim 1 wherein the core comprises, at least in part, a plurality of annealed nanoparticles of the wide band-gap material.

3. The apparatus of claim 1 wherein the core consists, at least in part, of a nanowire of the wide band-gap material.

4. The apparatus of claim 1 wherein the core comprises, at least in part, at least one of:
   a nanorod;
   a nanofibril;
   a fabric;
   a nanotube;
   of the wide band-gap material.

5. The apparatus of claim 1 wherein the wide band-gap material comprises at least one of:
   boron;
   iron;
   titanium;
   zinc;
   carbon; and
   silicon.

6. The apparatus of claim 5 wherein the wide band-gap material further comprises at least one of:
   a boride;
   a carbide;
   a nitride;
   an oxide; and
   a sulfide.

7. The apparatus of claim 1 wherein the wide band-gap material comprises at least one of:
   a boride;
   a carbide;
   a nitride;
   an oxide; and
   a sulfide.

8. The apparatus of claim 1 wherein the apparatus comprises a plurality of the cores that each have one of the shells disposed thereabout.

9. The apparatus of claim 8 wherein the plurality of cores are disposed with their longitudinal axes oriented at least substantially parallel to one another.

10. The apparatus of claim 9 wherein the lengths of the cores range from at least about 200 nanometers to no more than about 1500 nanometers.

11. The apparatus of claim 8 wherein at least some of the plurality of cores are electrically connected to a shared electrical pathway to facilitate a movement of electrons from the cores away from the cores.

12. The apparatus of claim 1 wherein the graphene and the core are at least in part electrically connected to a shared electrical pathway to facilitate a movement of positive charges from the graphene away from the graphene.

13. The apparatus of claim 12 wherein the shared electrical pathway comprises graphene.

14. The apparatus of claim 1 wherein the shell comprises, at least in substantial part, only a single layer of the graphene.

15. The apparatus of claim 1 wherein the shell comprises, at least in substantial part, no more than about five layers of the graphene.

16. The apparatus of claim 1 wherein the shell comprises, at least in substantial part, no more than about forty layers of the graphene.

17. The apparatus of claim 1 wherein a connection between a pathway connecting the shell and the core comprises a photovoltaic junction.

18. The apparatus of claim 1 wherein at least one of the core and the shell includes a dopant.

19. The apparatus of claim 18 wherein the dopant comprises at least one of an n-type dopant and a p-type dopant.

20. The apparatus of claim 1 wherein the at least one liquid-carrying conduit comprises a part of a parabolic solar collector.

21. An apparatus comprising:
   a core consisting essentially of a wide band-gap material, wherein the core has at least one bisectional dimension that does not exceed 100 nanometers;
   a shell consisting essentially of graphene conformally disposed about at least a substantial portion of the core;
   a Fresnel lens solar collector, wherein the core and shell are externally disposed on the Fresnel collector.

* * * * *

UNITED STATES PATENT AND TRADEMARK OFFICE
CERTIFICATE OF CORRECTION

PATENT NO. : 8,586,999 B1
APPLICATION NO. : 13/682229
DATED : November 19, 2013
INVENTOR(S) : Dieter M. Gruen Page 1 of 1

It is certified that error appears in the above-identified patent and that said Letters Patent is hereby corrected as shown below:

Title Page, Item (56)

Page 2, Column 2, Line 37: Change "Microelectroncs" to -- Microelectronics --;

Page 2, Column 2, Line 38: Change "Socety" to -- Society --;

Page 3, Column 1, Line 16: Change "Nanotechnololgy" to -- Nanotechnology --;

Page 3, Column 1, Line 19: Change "Nantubes" to -- Nanotubes --;

Page 3, Column 1, Line 49: Change "IAFf-02-R.4.06" to -- IAF-02-R.4.06 --; and

Page 3, Column 2, Line 31: Change "Heterstructure" to -- Heterostructure --.

Signed and Sealed this
Fifteenth Day of April, 2014

Michelle K. Lee
*Deputy Director of the United States Patent and Trademark Office*